US006320547B1

(12) United States Patent
Fathy et al.

(10) Patent No.: US 6,320,547 B1
(45) Date of Patent: Nov. 20, 2001

(54) SWITCH STRUCTURE FOR ANTENNAS FORMED ON MULTILAYER CERAMIC SUBSTRATES

(75) Inventors: Aly Eid Fathy, Langhorne, PA (US); Bernard Dov Geller, Princeton, NJ (US); Stewart Mark Perlow, Marlboro, NJ (US); Arye Rosen, Cherry Hill, NJ (US); Henry Charles Johnson, Cadis, KY (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/644,340

(22) Filed: Aug. 23, 2000

Related U.S. Application Data

(62) Division of application No. 09/305,796, filed on Apr. 30, 1999.
(60) Provisional application No. 60/095,689, filed on Aug. 7, 1998.

(51) Int. Cl.$^{7}$ .............................. H01Q 1/38; H05K 7/02
(52) U.S. Cl. .............................. 343/700 MS; 333/262; 361/781
(58) Field of Search .............................. 343/700 MS, 846, 343/853; 333/262, 137, 239; 361/760, 781; 257/664, 728

(56) References Cited

U.S. PATENT DOCUMENTS 5,387,888 * 2/1995 Eda et al. .............................. 333/247
5,903,421 * 5/1999 Furutani et al. .............................. 361/58
5,923,522 * 7/1999 Sajna .............................. 361/288

* cited by examiner

*Primary Examiner*—Don Wong
*Assistant Examiner*—Hoang Nguyen
(74) *Attorney, Agent, or Firm*—William J. Burke

(57) ABSTRACT

An array antenna includes a first ceramic layer and a second ceramic layer. A metal layer is disposed between the first and second ceramic layers. A plurality of radiating elements are mounted on the first ceramic layer, and a plurality of control circuits are mounted on the second ceramic layer. The control circuits are coupled to the radiating elements through a plurality of conductive vias which feed through the metal layer. The array antenna may also include a switch having a plurality of poles formed in the second ceramic layer and coupled to one of the radiating elements through one or more conductive vias. A plurality of phase delay elements may be coupled at a first end to a signal source and coupled at a second end to the respective plurality of poles of the switch to provide phase-delayed signals. A waveguide may also be formed within the ceramic layers. Conductive vias or coaxial transmission lines may be used to connect elements within the array antenna.

12 Claims, 6 Drawing Sheets

SWITCH STRUCTURE FOR ANTENNAS FORMED ON MULTILAYER CERAMIC SUBSTRATES

This application is a Divisional Application of U.S. Pat. Application No. 09/305,796 filed Apr. 30, 1999.

This application claims the benefit of U.S. Provisional Application No. 60/095,689 filed Aug. 7, 1998.

FIELD OF THE INVENTION

The present invention relates generally to antennas and, more particularly, to antennas formed using multilayer ceramic substrates.

BACKGROUND OF THE INVENTION

Antennas have become essential components of most modern communications and radar systems. One benefit of these antennas is the ability for their beams to be easily scanned or re-configured, as required by the system. Another benefit of these antennas is their ability to generate more than one beam simultaneously.

As operating frequencies rise, array antennas are desirably constructed as smaller devices. This is because the required spacing between radiating elements within the antenna is typically a function of wavelength. There is a strong technical incentive, therefore, to make these antennas compact.

In modern satellite services, each service generally covers a different frequency range, different polarization, and different space allocations. Consumers are interested in addressing these different services without having to use a different antenna to access each service.

Conventional solutions for designing a single antenna capable of communicating with various services entail the use of expensive phase shifters, typically using Monolithic Microwave Integrated Circuits (MIMIC) circuits. There is, therefore, also a strong commercial incentive, especially in the newly developing millimeter-wave LMDS and satellite services, to minimize size and cost.

As phased array antennas become smaller, however, it becomes more difficult to generate, distribute, and control the power needed to drive these devices.

In addition to the size constraints imposed on antennas by modern communications systems, higher frequency systems require the development of lower-loss power distribution techniques. Many RF systems operating in the millimeter-wave range, such as vehicular and military radars and various types of communications systems, require the distribution and collection of RF signals with minimal attenuation in order to maintain high efficiency and sensitivity. Conventional power distribution techniques, however, have associated problems which prevent this desired balance between efficiency, sensitivity and attenuation.

Planar antennas have been known to be very difficult to design, as they have historically used EM coupling from a buried feed network to radiating elements mounted on the surface of the antenna. In particular, EM waves are difficult to direct, and energy can leak in various directions, degrading the isolation between the feed network and the radiating elements. This problematic scenario is compounded if multiple signals having different polarizations are fed to the radiating elements, each polarization having its own feed network in a multi-level environment.

SUMMARY OF THE INVENTION

According to one aspect of the present invention, an array antenna includes a first ceramic layer and a second ceramic layer. A metal layer is disposed between the first and second ceramic layers. A plurality of radiating elements are mounted on the first ceramic layer, and a plurality of control circuits are mounted on the second ceramic layer. The control circuits are coupled to the radiating elements through a plurality of conductive vias which feed through the metal layer or other means.

The metal core layer serves several important functions. The metal core layer provides mechanical strength and structural support. In addition, the metal core layer may provide electrical shielding and grounding. The metal core layer also provides thermal management, as it is essentially a built-in heat sink, for efficient spreading of generated heat.

During firing, the metal core layer provides for minimal shrinkage in the plane of a structure in which the antenna is formed. The metal core layer also provides for confined and well-calculated shrinkage in directions normal to the plane of the structure in which the antenna is formed. The mechanical stability of the ceramic multilayers is maintained throughout processing and allows high density circuits to be screened over large areas of the ceramic with good registration between layers. Vias are precisely located, and conductor patterns with tight tolerances may be formed over a large area board.

According to other aspects of the present invention, the antenna may include a switch having a plurality of poles formed in the second ceramic layer and coupled to one of the radiating elements through one or more conductive vias. In addition, a plurality of phase delay elements may be coupled at a first end to a signal source and coupled at a second end to the respective plurality of poles of the switch. The plurality of phase delay elements may provide respective phase-delayed signals, in which case the switch would be activated to apply a selected one of the phase-delayed signals to the radiating element.

According to another aspect of the present invention, a waveguide is formed within a plurality of ceramic layers stacked on top of a metal layer. The waveguide may be shaped to branch into at least two portions in the plane of the ceramic layers.

According to another aspect of the present invention, an array antenna includes a first ceramic layer having a first feed element embedded therein, and a second ceramic layer having a second feed element embedded therein. A radiating element is disposed proximate the second ceramic layer opposite the first ceramic layer. A first ground plane is disposed between the first and second ceramic layers, and a second ground plane is disposed between the second ceramic layer and the radiating element. A first shielded coaxial transmission line feeds through the first and the second ground planes to couple the first feed element to the radiating element, and a second shielded coaxial transmission line feeds through the second ground plane to couple the second feed element to the radiating element.

According to another aspect of the present invention, a mechanical switch is formed in a plurality of ceramic layers stacked on top of a metal layer. A first electrode has a first portion disposed between a first pair of ceramic layers, and a second portion extends into a cavity formed in the ceramic layers. A second electrode has a fixed portion disposed between a second pair of the ceramic layers and a moveable portion extending into and moveable within the cavity to engage the first electrode.

According to another aspect of the present invention, an antenna includes a metal base layer, a first ceramic layer disposed on top of the metal base layer, and a first ground plane disposed on top of the first ceramic layer. A second ceramic layer is disposed on top of the ground plane, a second ground plane is disposed on top of the second ceramic layer, and a third ceramic layer is disposed on top of the second ground plane. A plurality of radiating elements are mounted on top of the third ceramic layer. A first distributed network is embedded in the first ceramic layer and coupled to the radiating elements through a plurality of vias which feed through the first and second ground planes to provide a first signal having a first polarization to the radiating elements. A second distributed network is embedded in the second ceramic layer and coupled to the radiating elements through a plurality of vias which feed through the second ground plane to provide a second signal having a second polarization to the radiating elements. A radiated signal provided by the radiating elements may be controlled in polarity and phase by controlling the first and second signals in magnitude.

The multi-layer capability of antennas constructed according to the present invention allows for design of compact structures, with short lengths between components, resulting in lower losses and better overall performance.

It is to be understood that both the foregoing general description and the following detailed description are exemplary, but are not restrictive, of the invention.

DETAILED DESCRIPTION OF THE INVENTION

Figure 1:
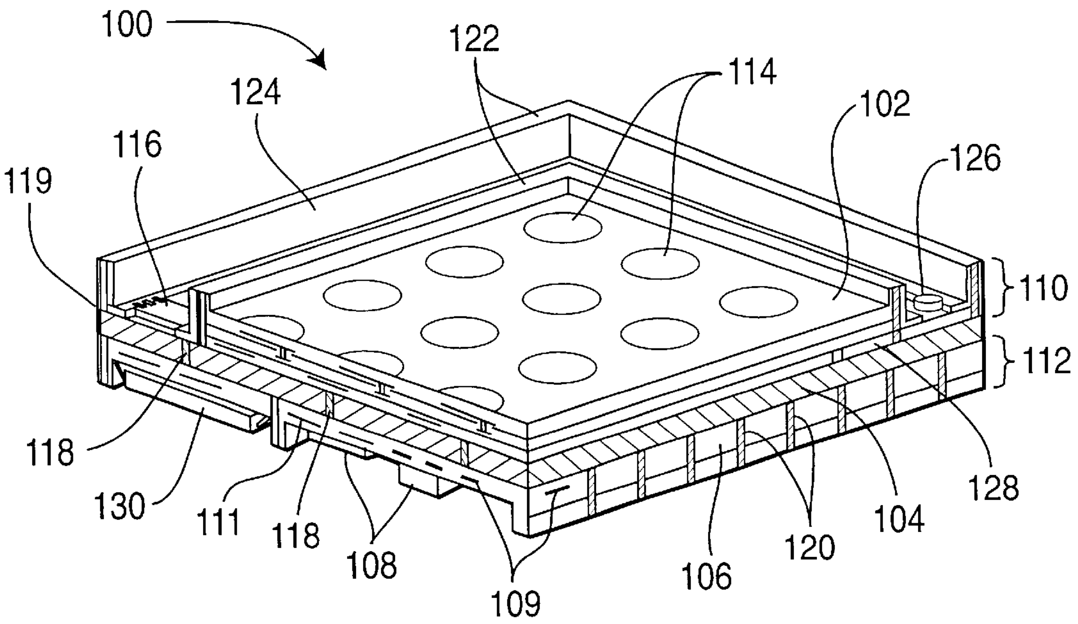
FIG. 1 is a cross-sectional view of an array antenna 100 implemented using an LTCC-M structure, according to an exemplary embodiment of the present invention.

The entire disclosure of U.S. patent application Ser. No. 09/305,796 filed Apr. 30, 1999, is expressly incorporated by reference herein.

It will be appreciated that the following description is intended to describe several embodiments of the invention that are selected for illustration in the drawings. The described embodiments are not intended to limit the invention, which is defined separately in the appended claims. The various drawings are not intended to be to any particular scale or proportion. Indeed, the drawings have been distorted to emphasize features of the invention.

Many problems associated with conventional antennas are avoided using "Low-Temperature Co-fired Ceramic on Metal" (LTCC-M) Technology to form substrates in which the antennas are constructed. A typical LTCC-M structure includes a metal core layer and at least one ceramic layer deposited on one or both sides of the metal core layer.

The metal core layer may be a Cu/Mo/Cu metal composite, because this material provides strong bonding to ceramic layers, although other materials such as titanium can be substituted. Openings or vias are formed in the metal core using a laser or mechanical drilling equipment. Vias in the metal core are preferably deburred and nickel plated.

Ceramic layers deposited on either side of the metal core layer are preferably dielectric glass layers. Typically, at least one dielectric glass layer is formed on both sides of the metal core layer, although a greater or lesser number of glass layers could be formed on either or both sides. The electronic properties of the ceramics and metals are suitable for high frequency operation.

Additional information regarding LTCC-M technology can be found in U.S. Pat. No. 5,277,724, entitled "Method of Minimizing Lateral Shrinkage in a Co-fired Ceramic-on-Metal Circuit Board," which is incorporated herein by reference.

FIG. 1 illustrates an integrated array antenna 100 implemented with an LTCC-M structure, according to an exemplary embodiment of the present invention. Array antenna 100 includes a first ceramic layer 102 mounted on one side of a metal core layer 104, and a second ceramic layer 106 mounted on the opposite side of metal core layer 104. Packaged surface-mount components 130 and 108 are attached to second ceramic layer 106. As indicated above, first ceramic layer 102 and second ceramic layer 106 can each be a single ceramic layer or a stack of ceramic layers.

Relatively higher frequency (e.g., RF) circuitry is preferably mounted on first ceramic layer 102. Circuitry operating at relatively lower frequency signals, such as control circuitry 108, is mounted on second ceramic layer 106. The lower frequency circuitry of array antenna 100 may also include printed passive components 109 conductors 111 embedded in second ceramic layer 106. As such, the relatively high frequency circuitry is segregated to one side 110 of metal core layer 104, while the relatively lower frequency circuitry is segregated to the opposite side 112.

In FIG. 1, a plurality of radiating elements 114 are mounted on the high frequency side 110 of metal core layer 104. Radiating elements 114 are shown in FIG. 1 as substantially circular metal patches, although such radiators may be formed in other shapes or as openings in a conductive sheet, and of other materials, as contemplated within the scope of the present invention. Radiating elements 114 are driven by high frequency signals, such as RF signals provided by high-frequency integrated circuits 116.

In FIG. 1, control circuits 108 are coupled to radiating elements 114 through a plurality of conductive vias 118 which feed through metal core layer 104. Conductive vias 118 are preferably silver-filled, although other conductive materials may be used. Conductive vias 118 route signals and voltages from the low frequency side 112 of the structure to the high frequency side 110. The metal substrate 104 provides shielding between portions of the LTCC-M structure which are desirably isolated from one another.

One or more shielding vias 119 may be formed in first ceramic layer 102 to shield portions of first ceramic layer 102 from one another. By the same token, a plurality of shielding vias 120 may be formed in second ceramic layer 106 to minimize interference between portions of second ceramic layer 106.

Included as part of array antenna 100, a power distribution network (not shown), such as the power divider structure described below with reference to FIG. 2, may be embedded in first ceramic layer 102. The power distribution network may be coupled between a power source and radiating elements 114 through conductive vias, and may distribute power to each radiating element with appropriate amplitude and phase.

In FIG. 1, a pair of shielding walls 122 having metallized surfaces, desirable for attaching a cover (not shown) to high frequency side 110 of array antenna 100, rise from first layer 102 in a direction away from metal core layer 104. Shielding walls 122 define a shielding channel 124, which is electromagnetically isolated from radiating elements 114 by shielding walls 122. Discrete circuit components (both passive and active) may be placed in shielding channel 124 for isolation from radiating elements 114. For example, active components such as the high-frequency integrated circuits 116, various transistors, and other integrated circuits may be seated within shielding channel 124. Passive components such as a magnet 126 may also be seated within shielding channel 124. Other circuit elements, such as resistors and capacitors, may be mounted on or embedded in other channels or cavities in antenna 100.

Also in FIG. 1, a ferrite layer 128 is disposed between metal core layer 104 and first layer 102 of the ceramic substrate, allowing the realization of components such as circulators and isolators. For example, a circulator may be implemented in microstrip form as a printed resonator with several connected strip lines. One or more magnets 126 may be positioned on either or both sides of the circulator. These magnets could be positioned on the surface of first ceramic layer 102 or in a cavity formed therein. If a plurality of dielectric ceramic layers were formed on high frequency side 110, a ferrite layer could be interspersed between these dielectric ceramic layers.

Features of array antenna 100 include the flexibility of using ceramic layers with high dielectric constants, and the capability of forming MEM (micro-electro-mechanical) components, such as switches. Exemplary micro-electromechanical switches are described in greater detail below with reference to FIGS. 9A–9D. These switches may be formed, for example, in the second ceramic layer 106 and coupled to one or more of radiating elements 114 through conductive vias. A waveguide may also be formed on high frequency side 110 of array antenna 100, for delivering RF or other high frequency signals to radiating elements 114 with low power loss. An exemplary waveguide in accordance with the present invention is described below with reference to FIGS. 2, 2A, and 2B.

One of many applications of array antenna 100 is a unit which provides a transmitter ray and a receiver ray for two-way communications. Typically, the transmitter ray and the receiver array would operate at different frequency bands. Thus, array antenna 100 could be designed to have two sub-arrays, one to handle the transmitter and one to handle the receiver. Also, wider arrays may be designed by placing multiple LTCC-M boards, such as the antenna of FIG. 1, essentially in a "tile" pattern. Multiple LTCC-M tiles could be combined to create larger antennas if desired. Various boards could have multiple ceramic layers and conductor patterns on either or both sides.

Figure 2:
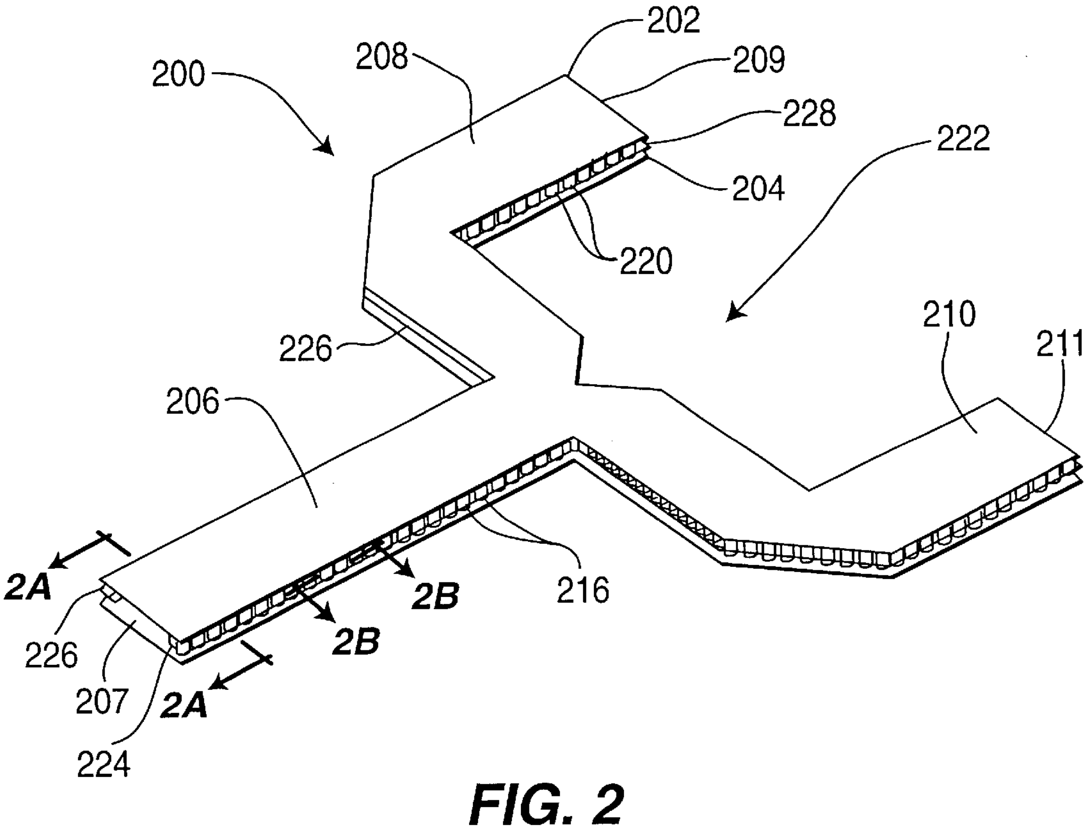
FIG. 2 is an isometric view of a waveguide 200 constructed as an integrated power divider or combiner for integration with an LTCC-M structure, according to an exemplary embodiment of the present invention.

FIG. 2 illustrates an exemplary waveguide 200 formed as a power divider or combiner structure for use in an LTCC-M structure. Waveguide 200 is particularly well suited for integration with a phased array antenna, such as array antenna 100 of FIG. 1. Launching into the waveguide can be accomplished easily with an integrated E-plane probe.

Waveguide 200 provides low loss high frequency RF power distribution within the LTCC-M structure. Such power distribution with minimal loss is desirable for high frequency technologies such as RF communications systems operating in the millimeter-wave range. Losses in a distribution network are minimized, particularly between the location where such higher frequency signals are generated and where they are radiated. Losses in the waveguide structure of FIG. 2 are primarily ohmic metal losses, rather than losses related to the ceramic filling the structure.

In FIG. 2, waveguide 200 includes a top metal wall 202 and a bottom metal wall 204. Metal walls 202 and 204 are desirably printed between ceramic layers on one side of an LTCC-M structure, such as the high frequency side 110 of array antenna 100, as broad metal strips. Waveguide 200 of FIG. 2 is configured as a power splitter or combiner and has a basic "Y" shape. At one end, the waveguide is in the shape of a single rectangular portion 206. Along the length of waveguide 200, this single rectangular portion branches into at least two distinct rectangular portions 208 and 210.

Waveguide 200 is preferably embedded within one or more ceramic layers. These ceramic layers may be stacked on one side of a metal core layer in an LTCC-M structure configured as an antenna, such as array antenna 100 in FIG. 1. One end of waveguide 200 may be coupled to high frequency circuits 116, while the other end of waveguide 200 is coupled to radiating elements 114 of array antenna 100. In this way, waveguide 200 would be configured to deliver power between the high frequency circuits 116 and radiating elements 114.

Figure 2A:
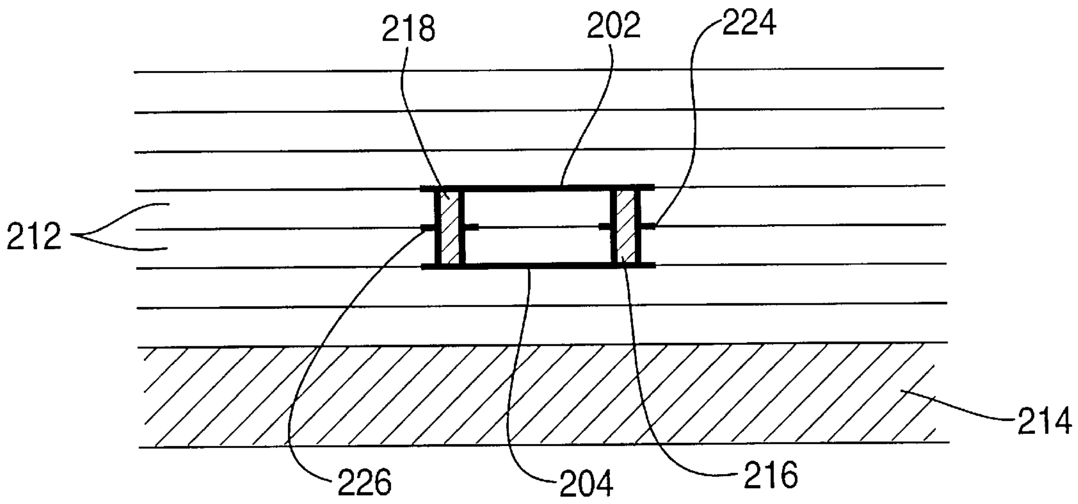
FIG. 2A is a side view of waveguide 200 in FIG. 2 from one end of waveguide 200 along lines 2A–2A.

FIG. 2A is a side view of waveguide 200 in FIG. 2 from one end 206 of waveguide 200 along lines 2A—2A. In the illustration of FIG. 2A, waveguide 200 is formed within a plurality of ceramic layers 212 stacked on top of a metal base layer 214. If forming waveguide 200 in phased array antenna 100 of FIG. 1, the waveguide may be embedded in one or more ceramic layers on high frequency side 110 of metal core layer 104 and coupled to radiating elements 114 through conductive vias to route signals provided by components 116 mounted in shielding channel 124.

Alternatively, apertures in waveguide walls may be used to couple radiating elements 114 to waveguide 200.

Figure 2B:
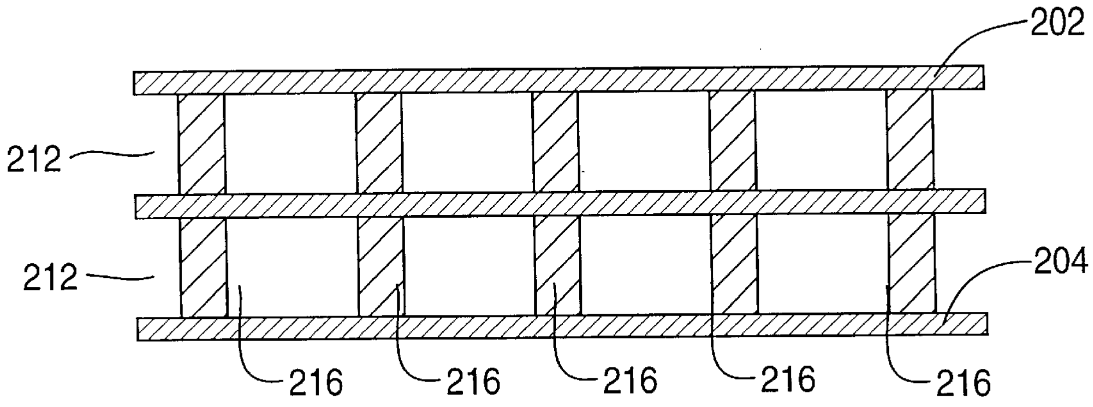
FIG. 2B is a side view of waveguide 200 in FIG. 2 along lines 2B—2B, in the same plane but substantially perpendicular with respect to the view along lines 2A—2A.

Viewing waveguide 200 of FIG. 2 along lines 2B—2B, a first plurality of conductive vias 216, shaped as cylindrical posts, are evenly distributed along at least a portion of the perimeter of the top and bottom metal walls 202 and 204 on the sides of waveguide 200. As shown in FIGS. 2A and 2B, each of the conductive vias 216 in the series connects top and bottom metal walls 202 and 204 through any ceramic layers 212 disposed therebetween.

A second plurality of conductive vias 218 are similarly formed on another side of the waveguide, as shown in FIG. 2A, and a third plurality of conductive vias 220 are similarly formed in a recessed portion 222 of the branched region of waveguide 200, as shown in FIG. 2. In this way, a discrete series of disjointed sidewalls are formed about the perimeter of waveguide 200, less openings 207, 209, and 211 of the waveguide. Sidewall conductive vias 216, 218, and 220, are relatively narrow with respect to broad metal walls 202 and 204, as shown in FIG. 2A.

As illustrated in FIGS. 2, 2A, and 2B, a first sidewall conductive strip 224 is interposed between first conductive vias 216, and a second sidewall conductive strip 226 is similarly formed between second conductive vias 218. As shown in FIG. 2, a third sidewall conductive strip 228, shaped for positioning within recessed portion 222 in the branched region 222 of waveguide 200, is interposed between third conductive vias 220 in that region.

In one example of the operation of waveguide 200, current is directed into opening 207 of waveguide 200 in dominant $TE_{10}$ propagation mode. While current flows both in the broad walls 202, 204, and narrow walls of the waveguide (defined by conductive vias 216 and 218), current in the narrow walls of waveguide 200 has only a vertical component. Thus, the electric field traverses vertically between the broad walls of the waveguide. Disjointed conductive vias 216 and 218 allow this vertical current to be maintained.

Figure 3:
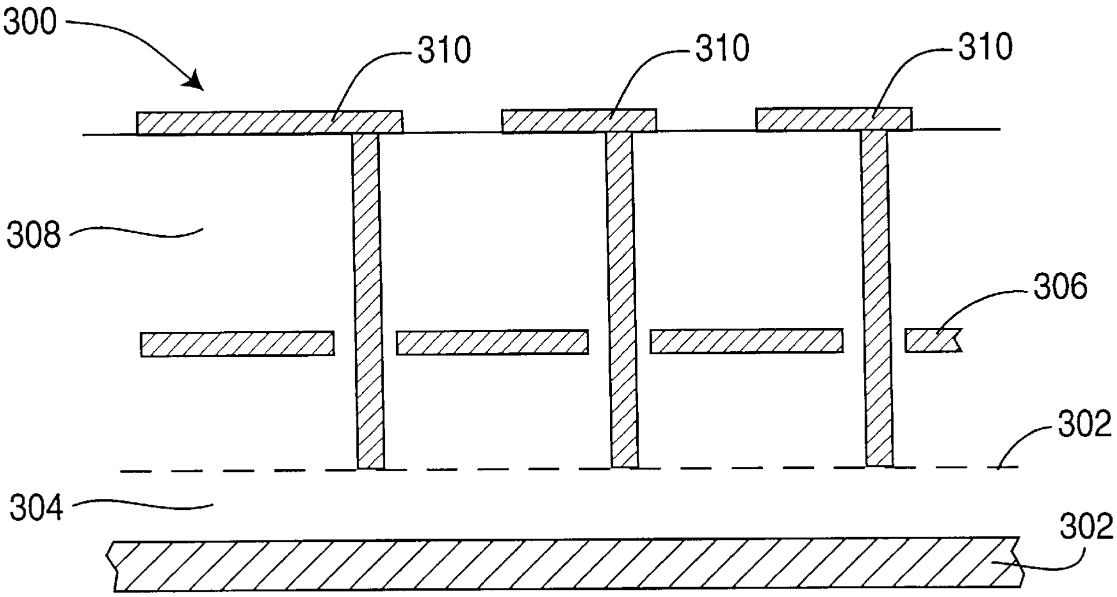
FIG. 3 is a cross-sectional side view of a planar antenna 300 formed using an LTCC-M structure, according to an exemplary embodiment of the present invention.

FIG. 3 illustrates an LTCC-M structure configured as a planar antenna 300. Planar antenna 300 is suitable for integration into low power, high frequency systems such as those found in both military and commercial receiver applications.

Planar antenna 300 has multiple layers, including a metal base layer 302. A first ceramic layer 304 is stacked on top of metal base layer 302, a ground plane 306 is stacked on top of first ceramic layer 304, and a second ceramic layer 308 is stacked on top of ground plane 306. A plurality of radiating elements 310 are mounted on top of second ceramic layer 308. If the planar antenna of FIG. 5 were formed in an LTCC-M structure such as that of FIG. 1, metal base layer 302 may correspond to metal core layer 104, and the additional ceramic layers, ground plane 306 and radiating elements 310 may all be stacked on high-frequency side 110 of the LTCC-M structure.

In FIG. 3, a distributed network 312 is embedded in first ceramic layer 304 and coupled to radiating elements 310 through a plurality of conductive vias 314 which feed through ground plane 306. Distributed network 312 is preferably a high density feed structure, through which signals of various polarizations may be transmitted. Another embodiment of the present invention configured for providing dual polarizations is discussed below with reference to FIG. 6. In FIG. 3, first ceramic layer 304 preferably has a high dielectric constant to facilitate propagation of higher frequency signals through distributed network 312. Second ceramic layer 308 preferably has a relatively low dielectric constant with respect to first ceramic layer 304 to allow for wide bandwidth operation of planar antenna 300.

In FIG. 3, direct connections of distributed network 312 to radiating elements 310 by conductive vias 314, shielded by ground plane 306 or not, is advantageous over conventional planar antennas. Planar antennas formed using LTCC-M technology have wider bandwidth transmission and reception, minimal isolation leaks, if any, less excitation of surface waves, and reduced cost in both design and integration.

Figure 4:
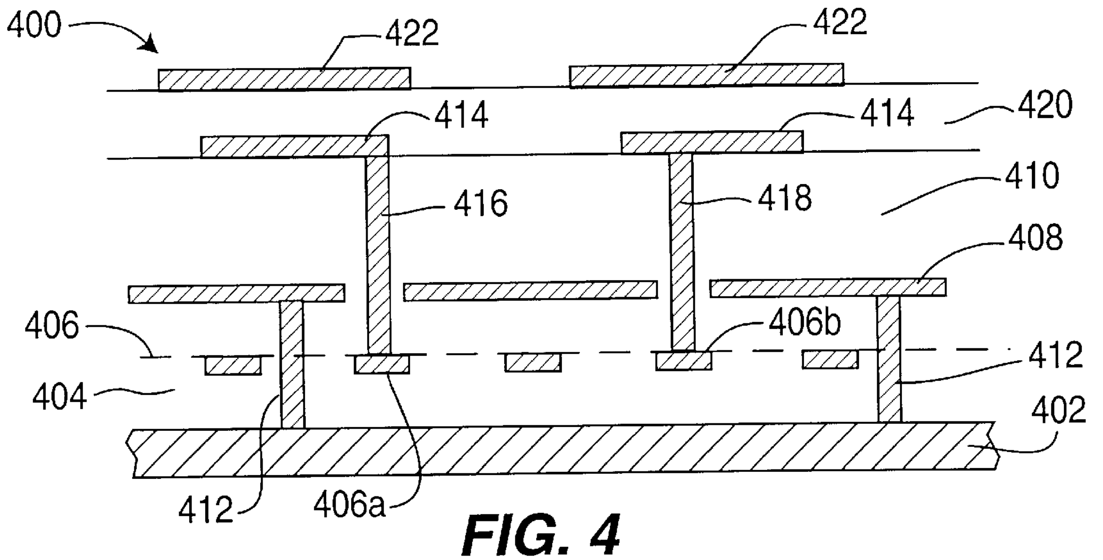
FIG. 4 is a cross-sectional side view of a planar antenna 400 formed using an LTCC-M structure, constructed according to an exemplary embodiment of the present invention.

FIG. 4 illustrates another configuration of a multi-layer planar antenna 400, formed according to an exemplary embodiment of the present invention. Antenna 400 is a multi-layer structure, similar in some respects to planar antenna 300 of FIG. 3. Planar antenna 400 may be formed, for example, on a single side of an LTCC-M structure, such as high-frequency side 110 of array antenna 100, with a metal base layer 402 corresponding to metal core layer 104 of antenna 100.

In FIG. 4, a first ceramic layer 404 is stacked on top of metal base layer 402, and a distributed network 406, such as a high-density strip-line feed network, is embedded in first ceramic layer 404. A ground plane 408 is printed on top of first ceramic layer 404, and a second ceramic layer 410 is stacked on top of ground plane 408. A plurality of shielding vias 412 are formed in first ceramic layer 404 to isolate portions of distributed network 406 and first ceramic layer 404 from one another. Shielding vias 412 also function to connect ground plane 408 to metal base layer 402, providing a common ground therebetween.

In FIG. 4, a plurality of radiating elements 414 are mounted on top of second ceramic layer 410. Various feed elements 406*a* and 406*b* of distributed network 406, are coupled to radiating elements 414 through conductive vias 416 and 418, which extend through ground plane 408. A third ceramic layer 420 is stacked on top of radiating elements 414 and portions of second ceramic layer 410 not covered by radiating elements 414. A plurality of parasitic radiating elements 422 are mounted on top of third ceramic layer 420. Each parasitic radiating element 422 is proximate to and paired with a respective radiating element 414, such that the pairs are capacitively coupled. The parasitic radiating elements 422 function to broaden the bandwidth at which array antenna 400 would otherwise be capable of operating.

Figure 5:
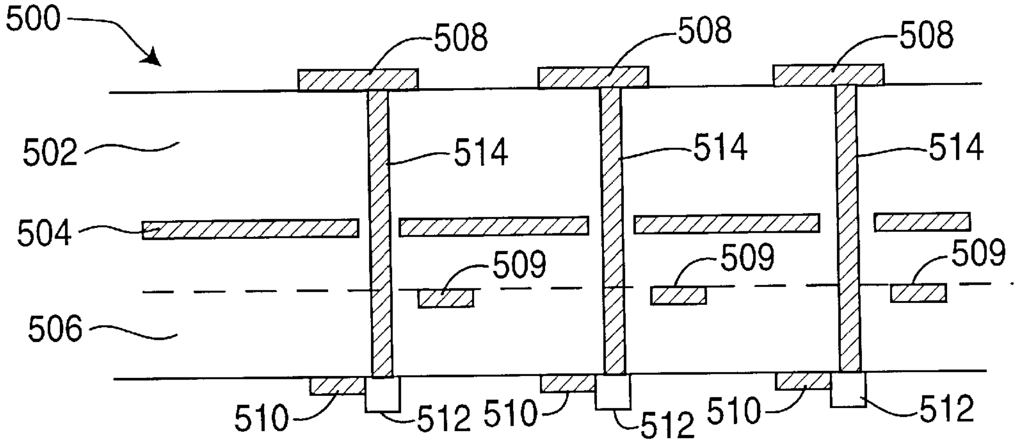
FIG. 5 is a cross-sectional side view of a planar antenna 500 formed in a double-sided LTCC-M structure, according to an exemplary embodiment of the present invention.

FIG. 5 illustrates a planar antenna 500 formed as a double-sided LTCC-M structure, according to an exemplary embodiment of the present invention. Planar antenna 500 includes a first ceramic layer 502 mounted on one side of a metal core layer 504, and a second ceramic layer 506 mounted on an opposite side of metal core layer 504. A plurality of radiating elements 508, preferably printed dipoles, are mounted on first layer 502. A plurality of discrete circuit components 509, such as capacitors and resistors, are embedded in second ceramic layer 506. Other circuit elements, both passive and active, may be embedded within second ceramic layer 506 as desired.

In FIG. 5, a distribution network 510 is mounted on a surface of second ceramic layer 506, rather than being embedded therein. A plurality of amplifiers 512 are also mounted on this surface of second ceramic layer 506. Each amplifier 512 is coupled between a feed element of distribution network 510 and a radiating element 518 through a conductive via 514 which feeds through metal core layer 504.

Surface distribution network 510 in planar antenna 500 of FIG. 5 may pass high frequency (e.g., RF, microwave, etc.) or relatively low frequency signals. In either case, the amplifiers receive these signals from the feed elements of distribution network 510, translate these signals to higher voltages, and pass the translated signals through conductive vias 514 to radiating elements 518.

Figure 6:
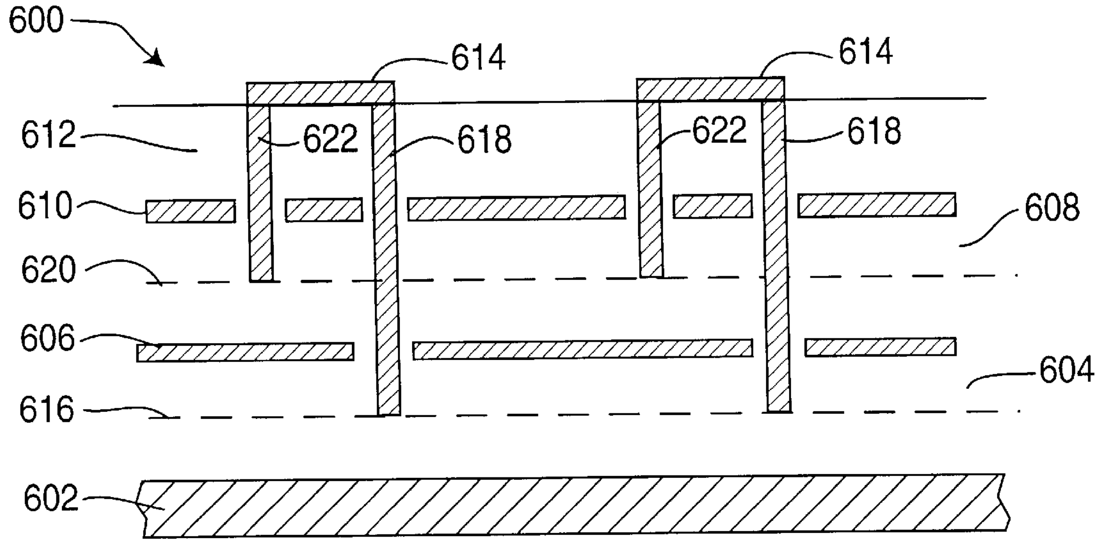
FIG. 6 is a cross-sectional side view of an antenna 600 formed using an LTCC-M structure and capable of operating with dual polarizations, according to an exemplary embodiment of the present invention.

FIG. 6 illustrates a dual-polarized radiating antenna 600 formed in an LTCC-M structure, according to an exemplary embodiment of the present invention. Antenna 600 includes a metal base layer 602, which may correspond to metal core layer 104 if antenna 600 were formed in the LTCC-M structure of FIG. 1. A first ceramic layer 604 is disposed on top of metal base layer 602, and a first ground plane 606 is printed on top of first ceramic layer 604. A second ceramic layer 608 is disposed on top of first ground plane 606, and a second ground plane 610 is printed on top of second ceramic layer 608. A third ceramic layer 612 is disposed on top of second ground plane 610, and a plurality of radiating elements 614 are mounted on top of third ceramic layer 612.

In FIG. 6, a first distribution network 616 is embedded in first ceramic layer 604. First distribution network 616 is configured as a strip line feed which is capable of carrying a first signal having a first polarization. At least one of the feed structures of first distribution network 616 is coupled to radiating elements 614 through conductive vias 618 which pass through first and second ground planes 606, 610. A second distribution network 620 is embedded in second ceramic layer 608. Second distribution network 620 is configured as a strip line feed which is capable of carrying a second signal having a second polarization. At least one of the feed structures of second distribution network 620 is coupled to radiating elements 614 through conductive vias 622 which pass through second ground plane 610.

In FIG. 6, first ground plane 606 provides shielding between first and second ceramic layers 604 and 610, thus preventing first and second signals transmitted therethrough from interfering with one another. Also, second ground plane 610 provides shielding for circuits embedded in the LTCC-M structure below second ground plane 610 from undesirable frequencies or noise possibly created by radiating elements 614.

When the first and second signals are propagating through the first and second ceramic layers 604 and 610, radiating elements 614 essentially "tap" these signals through direct via connections 618 and 622. Thus, one may control the polarity of the cumulative signal provided to radiating elements 614 from both distribution networks 616 and 620, by controlling the respective polarizations and amplitudes of the first and second signals.

Figure 7A:
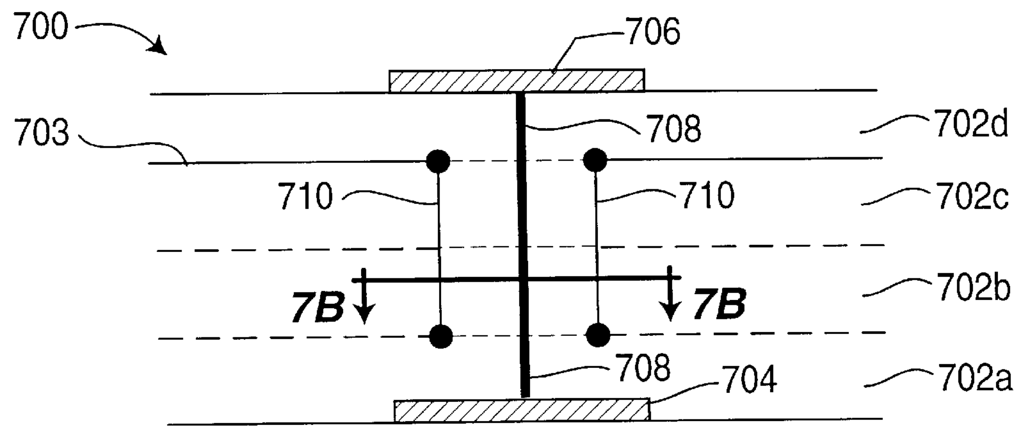
FIG. 7A is a cross-sectional side view of a coaxial transmission line 700 formed in an LTCC-M environment, according to an exemplary embodiment of the present invention.
Figure 7B:
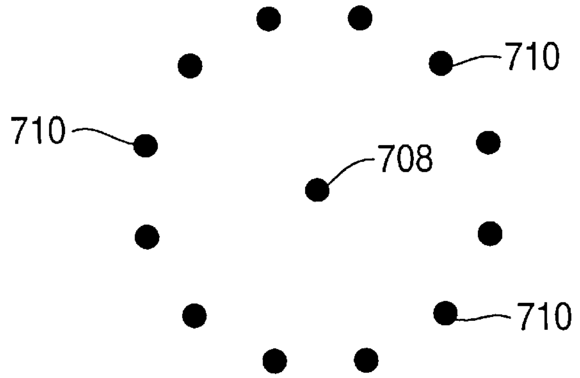
FIG. 7B is a cross-sectional end view of coaxial transmission 700 in FIG. 7A, taken along lines 7B—7B.

FIGS. 7A and 7B illustrate a coaxial transmission line 700 formed in an LTCC-M environment, according to one embodiment of the present invention. Specifically, FIG. 7A is a side view of coaxial transmission line 700, while FIG. 7B is an end view of coaxial transmission line 700 taken along lines 7B—7B in FIG. 7A.

Coaxial transmission line 700 is capable of conducting various elements in an LTCC-M structure, possibly as a substitute for conductive vias in configuration described above. Transmission line 700 is particularly well-suited for interconnecting a radiating element to a feed structure of a distribute network through one or more ceramic layers.

In FIG. 7A, a plurality of ceramic layers 702*a–d* are stacked on top of a metal pad 704 representing, for instance, a feed structure of a distributed network. A radiating element 706 is mounted on top of ceramic layer 702*d*. A conductive via is formed through ceramic layers 702*a–d,* defining an inner conductor 708 of coaxial transmission line 700. Inner conductor 708 extends through ceramic layers 702*a–d* to couple metal pad 704 to radiating element 706.

In FIG. 7A, a plurality of outer conductive vias extend through ones of ceramic layers 702. As better illustrated in FIG. 7B, this series of outer conductive vias are spaced apart from one another and distributed radially about inner conductor 708. The plurality of outer conductive vias defines a disjointed outer conductor 710 of coaxial transmission line 700. Outer conductor 710 and inner conductor 708 cooperate to provide direct EM coupling between metal pad 704 and radiating element 706.

In forming an LTCC-M structure to include coaxial transmission line 700, a ground plane 703 is desirably printed on top of ceramic layer 702*c* before layer 702*d* is stacked on top thereof, to provide a ground for outer conductor 710. Ground plane 703 is positioned to contact each of the outer conductive vias which define outer conductor 710 of transmission line 700, when such conductive vias are formed in the LTCC-M structure. Ground plane 703 preferably does not extend substantially into coaxial transmission line 700 between outer conductor 710 and inner conductor 708 although slight misalignments may occur in manufacturing. Ground plane 703 may also be positioned between ceramic layers 702*b* and 702*c* or between layers 702*a* and 702*b* to provide the desired ground contact.

The use of LTCC-M technology in constructing antennas provides for smooth and well-matched transitions between different "feed levels" to radiating elements of the antenna. For example, in FIG. 6, each ceramic layer 604 and 608 with its respective embedded distribution network 616 and 620 may represent a different feed level. Because of the shielding provided by ground plane 606, each feed level may pass a distinct signal with minimal interference from other feed levels.

A plurality of feed levels may be directly connected to one or more radiating elements by conductive vias, as in FIG. 6, such that a given radiating element "taps" selected ones of the feed levels to transmit the signals passing through those feed levels. Using conductive vias to make these direct connections is desirable in some applications, as it requires low cost punching, and is simple and easy to design. Alternatively, LTCC-M technology can support shielded coaxial feedthrough, such as that illustrated in FIGS. 7A and 7B, to prevent cross-coupling between different feed levels.

Figure 8:
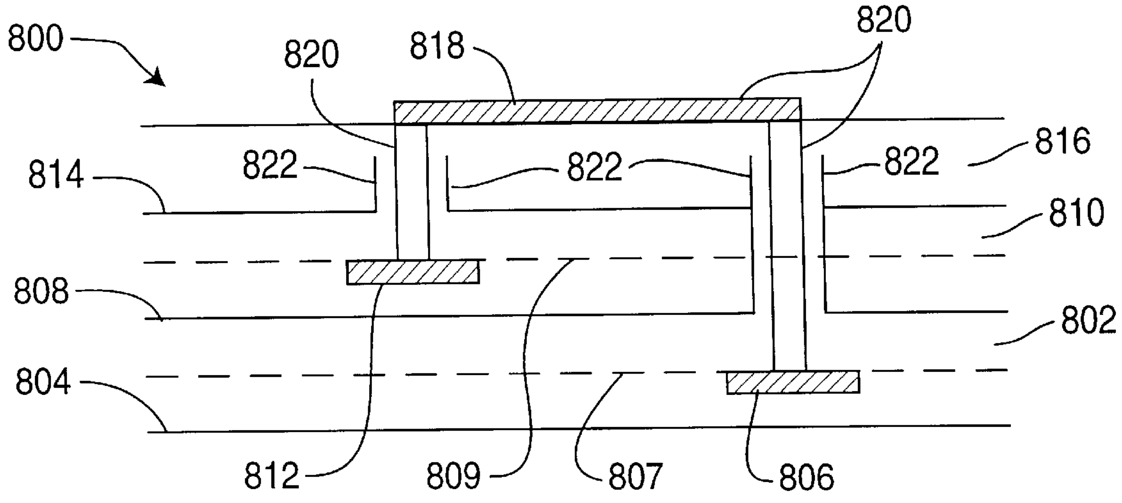
FIG. 8 is a cross-sectional side view of a dual-phase array antenna 800 formed with coaxial transmission lines, according to an exemplary embodiment of the present invention.

FIG. 8 illustrates a dual-phase array antenna 800, constructed in accordance with the present invention. Coaxial transmission lines such as those described above with reference to FIGS. 7A and 7B are used to form connections between various layers.

In FIG. 8, antenna 800 includes a first ceramic layer 802 deposited on top of a base ground plane 804. A first feed element 806 of a first distributed network 807 is embedded in ceramic layer 802. A first ground plane 808 is printed on top of first ceramic layer 802. A second ceramic layer 810 is disposed on top of first ground plane 808 and has a second feed element 812 embedded therein. Second feed element 812 is one element of a second distributed network 809. A second ground plane 814 is disposed on top of second ceramic layer 810. A third ceramic layer 816 is disposed on top of second ground plane 814, and a radiating element 818 is disposed on top of third ceramic layer 816.

In FIG. 8, a first shielded coaxial transmission line extends through: (i) a portion of first ceramic layer 802, (ii) first and second ground planes 808 and 814, and (iii) both second and third ceramic layers 810 and 816, to couple first feed element 806 to radiating element 818. Similarly, a second shielded coaxial transmission line extends through: (i) a portion of second ceramic layer 810, (ii) second ground plane 814, and (iii) third ceramic layer 816, to couple second feed element 812 to radiating element 818.

In the antenna of FIG. 8, each of the first and second shielded coaxial transmission lines are defined by a coaxial inner conductor 820 in the form of a conductive via, and a hollow via which surrounds inner conductor 820. In each coaxial transmission line, a coaxial shield 822 is constructed around the hollow via and spaced apart from coaxial inner conductor 820 by virtue of the hollow via. Other forms of coaxial transmission lines, such as those described with reference to FIGS. 7A and 7B, may be used to make the desired connections.

When the dual-phase array antenna of FIG. 8 is in operation, a first signal having a first polarization propagates through first ceramic layer 802. In this way, first ceramic layer 802 functions as a first feed-level. Similarly, a second signal having a second polarization propagates through second ceramic layer 810, such that second ceramic layer 810 functions as a second feed-level. First ground plane 808 isolates the first and second feed levels from one another.

Because radiating element 818 is coupled to both feed levels through the coaxial transmission lines, in the manner described above, radiating element 818 "taps" both the first signal and its first polarization, as well as the second signal and its second polarization through the respective coaxial connections.

In one example, where the first polarization is substantially vertical, and the second polarization is substantially horizontal, both the vertical and horizontal polarizations are provided to radiating element 818 through the respective coaxial transmission lines. Thus, the polarity of a signal generated by radiating element 818 may be controlled by controlling the respective magnitudes of the first and second signals.

While the configuration of FIG. 8 shows only two feed levels, it is contemplated that a multi-phase array antenna may be similarly designed. For example, additional ceramic layers with embedded feed elements could be stacked between third ceramic layer 816 and radiating element 818 of antenna 800. Ground planes would be interspersed between the various ceramic layers to provide shielding between the feed levels, similar to the existing arrangement in dual-phase array antenna 800 of FIG. 8. Dual-phase or multi-phase array antennas formed in this manner minimize cross-coupling between the various feed levels, in addition to maximizing excitation of radiating elements.

Steerable antennas made in LTCC-M structures, according to the present invention, are capable of addressing communications services operating at various frequencies, polarizations, and space allocations. To reduce the cost of designing these steerable antennas, micro-machined electromechanical miniature switches (MEMS) may be used to access or provide various signals with distinctive characteristics. In particular, MEMS can be used to build low-cost phase shifters to achieve the desired steerability of a phased array antenna.

A method of making a micro-machined electromechanical switch in an LTCC-M environment is described herein with reference to FIGS. 9A–9D. In an exemplary embodiment, a plurality of these switches may be mounted on one side of a double-sided LTCC-M structure, while control circuitry may be mounted on the other side. For example, if constructed in the LTCC-M structure of FIG. 1, a plurality of micro-machined switches would be formed on the high frequency side 110 of the structure and coupled between: (i) signal sources having distinctive phases, and (ii) radiating elements 114. Such an antenna construction would be easily "steerable," in that the micro-machined switches would provide easy switching between the different polarities.

Figure 9A:
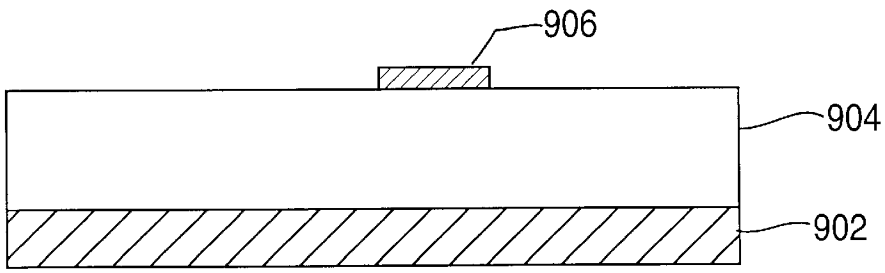
FIGS. 9A–9D are cross-sectional side views of an LTCC-M structure, showing the formation of a micromachined electro-mechanical switch therein, according to an exemplary embodiment of the present invention.

The structure of FIG. 9A is formed upon a metal base layer 902. A first ceramic layer 904 is stacked on top of metal base layer 902. A stimulus pad 906, which is capable of exerting an electrostatic force, is deposited on top of ceramic layer 904.

Figure 9B:
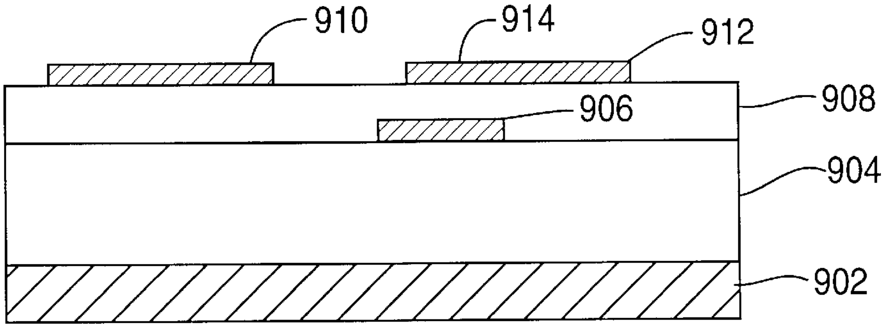

In FIG. 9B, a second ceramic layer 908, preferably thinner than first ceramic layer 904, is stacked on top of stimulus pad 906 and first ceramic layer 904. A first metal member 910 and a second metal member 912 are deposited on top of second ceramic layer 908. Metal members 910 and 912 may be, for example, elements of a printed transmission line. First and second metal members 910 and 912 are spaced apart, as illustrated in FIG. 11B, and one end 914 of second metal member 912 is positioned directly above stimulus pad 906. First metal member 910 defines a base of a moveable electrode, while second metal member 912 defines a fixed electrode for the switch.

Figure 9C:
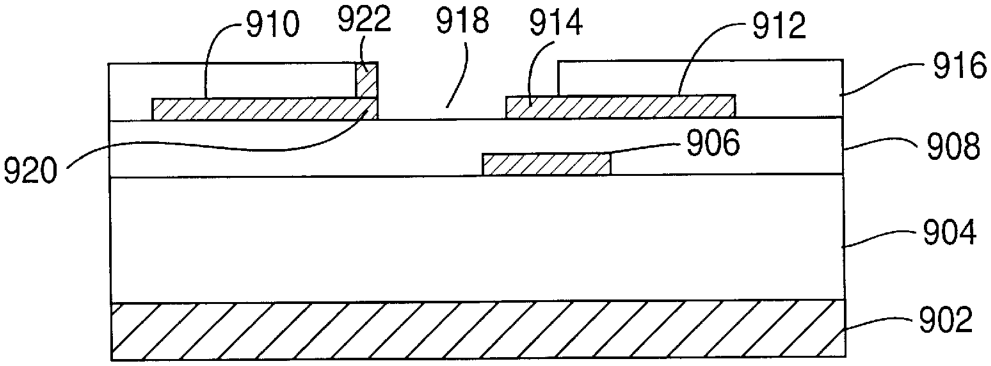

In FIG. 9C, a third ceramic layer 916, also preferably thinner than first ceramic layer 904, is stacked on top of first and second members 910 and 912, as well as portions of second ceramic layer 908 not covered by metal members 910 and 912. A cavity 918 is formed in third ceramic layer 916, such that a tip 920 of first metal member 910 juts out from between second and third ceramic layers 908 a nd 916, and extends into cavity 918. Also, the positioning of cavity 918 is such that end portion 914 of second metal member 912 juts out from between second and third ceramic layers 908 and 916, and extends into cavity 918 opposite tip 920 of first metal member 910. Cavity 918 may be punched or etched in third ceramic layer 916, although punching is generally preferred as the cheaper alternative.

In FIG. 9C, a conductive element 922 is deposited vertically along one wall of cavity 918, extending from tip 920 of first metal member 910 to the top of third ceramic layer 916. First metal member 910 and vertical conductive element 922 define a base and a stand, respectively, for mounting a moveable electrode 924 of a micro-machined switch according to one embodiment of the present invention. Conductive element 922 can be formed simply and easily in LTCC-M boards. In the exemplary embodiment of the invention, movable electrode 924 is a flexible conductor such as mylar and is mounted on the stand 922 after the LTCC-M structure has been fired.

Figure 9D:
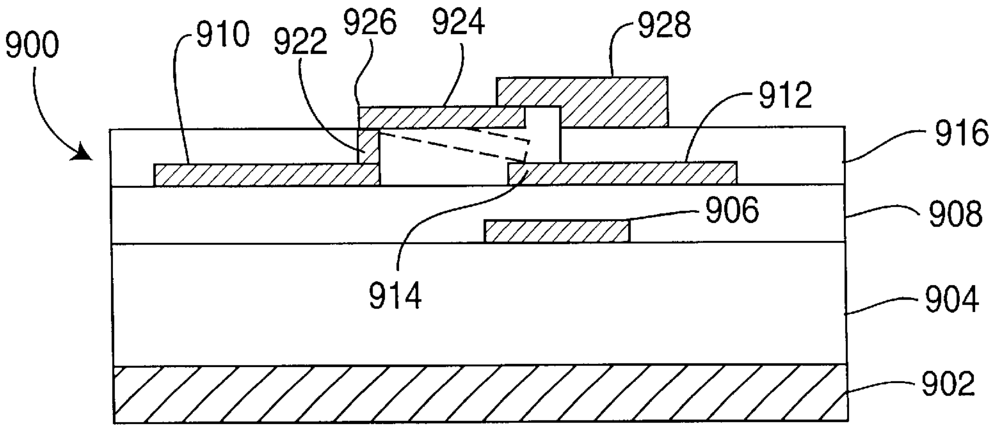

The completed micro-machined switch 900 is shown in FIG. 9D, where moveable electrode 924 is mounted for selective engagement with second metal member 912. A tip 926 of moveable electrode 924 is secured to one end of conductive element 922 opposite first metal member 910. The remainder of moveable electrode 924 extends substantially horizontally into cavity 918 and swings freely therein. A pole 928, shaped as illustrated in FIG. 9D, is deposited such that the moveable portion of electrode 924 is in contact therewith when essentially no voltage is applied to stimulus pad 906. When voltage is applied to stimulus pad 906, an electrostatic force pulls the moveable portion of electrode 924 away from pole 928 and towards end portion 914 of second metal member 912 into contact therewith. An electrostatic voltage in the range of 30–40 volts is desirably applied to stimulus pad 906 to achieve consistent switching between pole 928 and end portion 914 of second substrate 912.

In FIG. 9D, the fixed and moveable electrodes of switch 900 are isolated from one another, due to the multi-layering in the LTCC-M structure. The stimulus is also isolated, as it is constructed on a different layer, to ensure short circuit protection.

MEMS such as switch 900 have been designed and fabricated on both alumina and semi-insulating GaAs substrates using suspended cantilevered arms. These switches demonstrate good switching capabilities from DC to microwave frequencies, provide excellent isolation, and minimal insertion loss. In addition, MEMS constructed in accordance with the present invention can easily provide switching speeds on the order of several milliseconds, which are adequate for most applications.

To achieve the desired wide-band steerability with a phased array antenna, it is advantageous to design the antenna to include a phased array network having a plurality of phase shifting units. Switches such as the MEMS described above with reference to FIGS. 9A–9D may be used as basic building blocks in these phase shifter applications.

Figure 10:
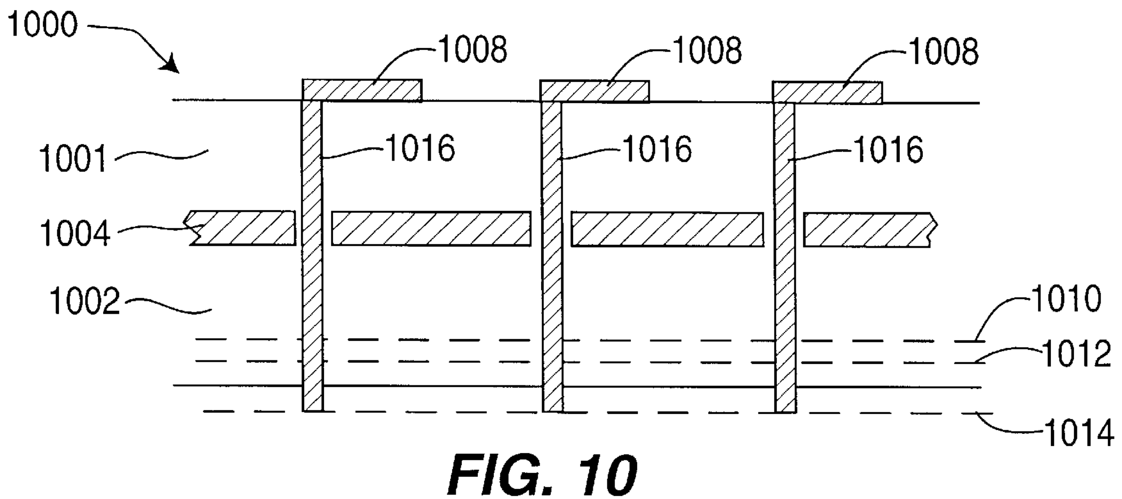
FIG. 10 is a cross-sectional side view of a phased array antenna 1000 formed in a double-sided LTCC-M structure, including switches and phase shifters, according to an exemplary embodiment of the present invention.

FIG. 10 is a side view of a phased array antenna 1000 formed in a double-sided LTCC-M structure, according to an exemplary embodiment of the present invention. Antenna 1000 includes a first ceramic layer 1001 mounted on one side of a metal core layer 1004, and a second ceramic layer 1002 mounted on an opposite side of metal core layer 1004. First ceramic layer 1001 preferably has a relatively low dielectric constant, while second ceramic layer 1002 preferably has a relatively high dielectric constant.

A plurality of radiating elements 1008 are mounted on first layer 1001. A plurality of switches 1010, such as the MEMS described in FIG. 9D above, are embedded in second ceramic layer 1002. Also embedded in second ceramic layer 1002 are phase shifters 1012, which are connected to switches 1010. Other circuit elements, both passive and active, may be embedded within second ceramic layer 1002 depending upon the desired implementation.

In FIG. 10, a distribution network 1014 is mounted on a surface of second ceramic layer 1002. Selected feed structures within distribution network 1014 are coupled to radiating elements 1008 through a plurality of conductive vias 1016 which feed through metal core layer 1004. Distribution network 1014 may pass high frequency (e.g., RF, microwave, etc.) or relatively low frequency signals. Various phase shifters 1012 translate these signals to have various polarizations, and switches 1010 are selectively activated to pass these translated signals through conductive vias 1016 to radiating elements 1008.

Figure 11A:
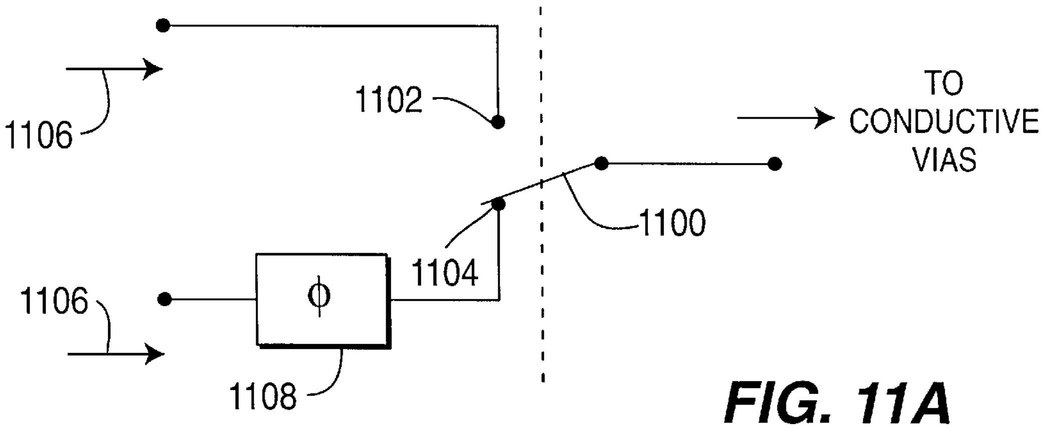
FIGS. 11A and 11B are circuit diagrams illustrating phase shifters and switches and connections therebetween which may be used in constructing phased-array antennas according to the present invention.
Figure 11B:
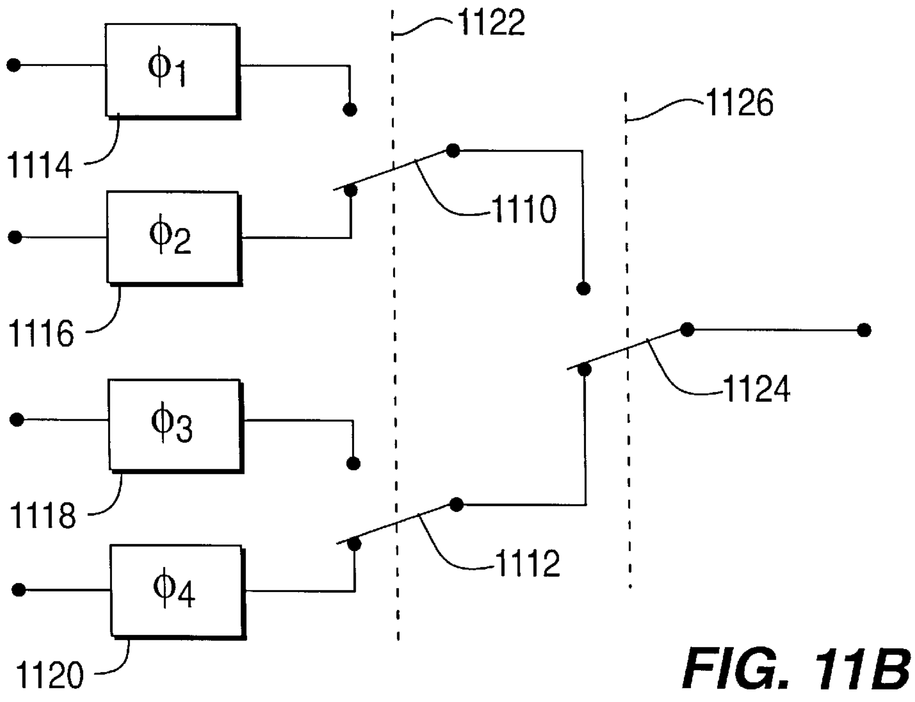

FIGS. 11A and 11B are circuit diagrams illustrating possible connections between phase shifters and switches used in antennas according to exemplary embodiments of the present invention. In FIG. 11A, a switch 1100 configured, for example, as switch 900 described in FIG. 9D above, toggles between poles 1102 and 1104. Switch 1100 passes an input signal 1106, such as a signal provided by feed structures within a distributed network, directly, when switch 1100 contacts pole 1102. When switch 1100 contacts pole 1104, switch 1100 passes a phase-delayed input signal 1106, as input signal 1106 must pass through phase shifter 1108 before passing through switch 1100 and on to external circuitry.

FIG. 11B illustrates a two-stage switching arrangement using a plurality of phase shifters for driving a wideband antenna with signals having four possible polarizations, Ø1, Ø2, Ø3, and Ø4. A first switch 1110 toggles between phase shifters 1114 and 1116, while a second switch 1112 toggles between phase shifters 1118 and 1120. Switches 1110 and 1112 are each selectively activated by control line 1122. A third switch 1124 is selectively activated by control line 1126, and toggles between the signals passed by first switch 1110 and 1112.

Steering of antennas according to exemplary embodiments of the present invention may be in one plane or two planes. In the case of one plane, only one column of phase shifters is used, while a 2-dimensional array of phase shifters would be used for steering in two planes. Wideband steering of these antennas may also be performed in multiple planes using multiple arrays of phase shifters.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed is:

1. A switch formed in a plurality of ceramic layers stacked on top of a metal layer comprising:

a first electrode having a first portion disposed between a first pair of the ceramic layers and a second portion extending into a cavity formed in the ceramic layers; and a second electrode having a fixed portion disposed between a second pair of the ceramic layers and a moveable portion extending into and moveable within the cavity to engage the first electrode.

2. The switch of claim 1 further comprising a stimulus pad proximate the first electrode opposite the second electrode, the stimulus pad configured to exert an electrostatic force to pull the moveable portion of the second electrode to engage the first electrode.

3. A method of making a switch in a plurality of ceramic layers stacked on top of a metal layer comprising:

depositing a metal layer;

depositing a first ceramic layer on top of the metal layer;

depositing a stimulus pad on top of the first ceramic layer;

depositing a second ceramic layer on top of the stimulus pad and the first ceramic layer;

depositing a first metal patch and a second metal patch on top of the second ceramic layer, the second metal patch being proximate the stimulus pad;

depositing a third ceramic layer atop the first and second metal patches and the second ceramic layer;

forming a cavity in the third ceramic layer such that a portion of the second metal patch extends into the cavity to define a first electrode;

forming a stand which extends vertically from the first metal patch along a wall of the cavity;

attaching one end of a third metal patch to an end of the stand opposite the first metal patch to define a second electrode, the third metal patch being a hinged portion of the second electrode moveable within the cavity to engage the first electrode.

4. A switch formed in a plurality of ceramic layers, comprising:

a first electrode having a first portion disposed between a first pair of the ceramic layers and a second portion extending into a cavity formed in at least one of the ceramic layers;

a second electrode having a fixed portion disposed between a second pair of the ceramic layers and a moveable portion extending into and moveable within the cavity; and a stimulus pad proximate the first electrode and opposite the second electrode, the stimulus pad configured to exert an electrostatic force to pull the moveable portion of the second electrode to engage the first electrode.

5. A switch according to claim 4, wherein the movable portion of the second electrode includes a flexible conductor.

6. A switch according to claim 4, further including a third electrode having a first portion disposed on one of the ceramic layers and a second portion extending into a cavity formed in the ceramic layers such that the movable portion of the second electrode is in contact with one of the first and third electrodes responsive to a stimulus applied to the stimulus pad.

7. A switch according to claim 6, wherein:

the plurality of ceramic layers are stacked ceramic layers;

the stimulus pad is disposed between a base layer and a first layer;

the first pair of ceramic layers includes the first layer and a second layer wherein the cavity is formed in the second layer;

the second pair of ceramic layers includes the first layer and the second layer; and the third electrode is disposed on the second layer, wherein the first and second layers are thinner than the base layer.

8. A switch according to claim 4, wherein:

the plurality of ceramic layers are stacked ceramic layers in an antenna structure having a high-frequency side and a low-frequency side;

the cavity is formed in a ceramic layer on the high frequency side of the antenna structure; and the switch further comprises control circuitry coupled to the stimulus pad, the control circuitry being mounted on the low-frequency side of the antenna structure and being coupled to the stimulus pad through at least one of the stacked ceramic layers.

9. A switch according to claim 4, wherein the stacked ceramic layers are formed from alumina.

10. A switch according to claim 4, wherein the stacked ceramic layers are formed semi-insulating GaAs.

11. A switched antenna structure formed in a plurality of ceramic layers, the plurality of ceramic layers having a high-frequency side and a low frequency side, the switched antenna structure comprising:

a plurality of antenna elements formed on the high-frequency side of the plurality of ceramic layers;

a plurality of switch elements, each switch element comprising:

a first electrode having a first portion disposed between a first pair of the ceramic layers and a second portion extending into a cavity formed in the ceramic layers;

a second electrode having a fixed portion disposed between a second pair of the ceramic layers and a moveable portion extending into and moveable within the cavity, wherein the first portion of the second electrode is connected to a respective one of the plurality of antennas; and a stimulus pad proximate the first electrode opposite the second electrode, the stimulus pad configured to exert an electrostatic force to pull the moveable portion of the second electrode to engage the first electrode;

a plurality of waveguides, each waveguide being coupled to provide a signal having a respective phase to a respective one of the first electrodes of the plurality of switch elements.

12. A switched antenna structure formed in a plurality of ceramic layers, the plurality of ceramic layers having a high-frequency side and a low-frequency side, the switched antenna structure comprising:

a plurality of antenna elements formed on the high-frequency side of the plurality of ceramic layers;

a plurality of switch elements, each of the switch elements comprising:

a first electrode having a first portion disposed between a first pair of the ceramic layers and a second portion extending into a cavity formed in at least one of the ceramic layers;

a second electrode having a fixed portion disposed between a second pair of the ceramic layers and a moveable portion extending into and moveable within the cavity;

a third electrode having a first portion disposed on one of the ceramic layers and a second portion extending into a cavity formed in the ceramic layers; and a stimulus pad proximate the first electrode opposite the second electrode, the stimulus pad configured to exert an electrostatic force to pull the moveable portion of the second electrode to engage one of the the first electrode and the third electrode;

a first plurality of waveguides coupled to provide signals having respective phases to respective ones of the first electrodes of respective ones of the plurality of switches;

a second plurality of waveguides coupled to provide a signal having a respective phase to a respective one of the third electrodes of a respective one of the plurality of switches;

wherein at least one of the plurality of switches is coupled, at its first and third electrodes to respective second electrodes of ones of the switches that are coupled to ones of the first and second plurality of wave guides, and coupled, at its second electrode to at least one of the antennas.

* * * * *